US012695245B2

(12) United States Patent　　　(10) Patent No.:　US 12,695,245 B2

Kuroda et al.　　　　　　　　　(45) Date of Patent:　　Jul. 28, 2026

(54) ELECTRICAL UNIT AND ATTACHMENT METHOD

(71) Applicant: Sumitomo Wiring Systems, Ltd., Yokkaichi (JP)

(72) Inventors: Atsushi Kuroda, Yokkaichi (JP); Akihiro Oda, Yokkaichi (JP); Ryoma Hamada, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 243 days.

(21) Appl. No.: 18/555,816

(22) PCT Filed: Mar. 22, 2022

(86) PCT No.: PCT/JP2022/012984

§ 371 (c)(1),
(2) Date: Oct. 17, 2023

(87) PCT Pub. No.: WO2022/224665

PCT Pub. Date: Oct. 27, 2022

(65) Prior Publication Data

US 2024/0213717 A1　　Jun. 27, 2024

(30) Foreign Application Priority Data

Apr. 23, 2021　(JP) ................................. 2021-073412

(51) Int. Cl.
H01R 13/631　　　(2006.01)
H01R 13/627　　　(2006.01)
(Continued)

(52) U.S. Cl.
CPC ....... H01R 13/631 (2013.01); H01R 13/6272 (2013.01); H01R 33/94 (2013.01); H01R 43/26 (2013.01); H05K 5/0069 (2013.01)

(58) Field of Classification Search
CPC .. H01R 13/631; H01R 13/6272; H01R 33/94; H05K 5/0069
(Continued)

(56) References Cited

U.S. PATENT DOCUMENTS

| 9,985,400 | B2 * | 5/2018 | Kawaguchi ............. B60R 16/03 |
| 2008/0166909 | A1 | 7/2008 | Kubota et al. |
| 2017/0310065 | A1 | 10/2017 | Kawaguchi et al. |

FOREIGN PATENT DOCUMENTS

| JP | S57-4283 A | 1/1982 |
| JP | 2007-181050 A | 7/2007 |

OTHER PUBLICATIONS

International Search Report, Application No. PCT/JP2022/012984, mailed Jun. 14, 2022. ISA/Japan Patent Office.

* cited by examiner

*Primary Examiner* — Gary F Paumen

(74) *Attorney, Agent, or Firm* — Brooks Kushman P.C.

(57) ABSTRACT

An electrical unit including a casing-shaped junction box having one surface provided with an engagement recess, and an ECU configured to be attached to the one surface and having an engagement portion configured to slide over the one surface and engage with the engagement recess, the electrical unit including: a slit formed in the one surface and configured to guide sliding of the engagement portion to the engagement recess; and a rib provided on the engagement portion and configured to be inserted into the slit during sliding of the engagement portion.

6 Claims, 12 Drawing Sheets

(51) Int. Cl.
    *H01R 33/94*        (2006.01)
    *H01R 43/26*        (2006.01)
    *H05K 5/00*         (2025.01)
(58) Field of Classification Search
    USPC .......................................................... 439/376
    See application file for complete search history.

ELECTRICAL UNIT AND ATTACHMENT METHOD

CROSS-REFERENCE TO RELATED APPLICATIONS

This application is the U.S. national stage of PCT/JP2022/012984 filed on Mar. 22, 2022, which claims priority of Japanese Patent Application No. JP 2021-073412 filed on Apr. 23, 2021, the contents of which are incorporated herein.

TECHNICAL FIELD

The present disclosure relates to an electrical unit and an attachment method.

BACKGROUND

Conventionally, an electrical unit in which an electronic control unit (ECU) is attached to a junction box has been proposed.

For example, JP 2008-172889A discloses an electrical connection box that includes a flattened casing-shaped ECU provided with shaft portions that respectively protrude from two end portions of one side surface, and a junction box in which shaft receiving portions corresponding to the shaft portions are provided at corners of a rectangular recess, wherein the shaft portions of the ECU are slid over a bottom surface of the recess and engaged with the shaft receiving portions, and then the ECU is pivoted about the shaft portions, thus attaching the ECU to the recess.

However, in the electrical connection box disclosed in JP 2008-172889A, when the shaft portions of the ECU are slid over the bottom surface of the recess, the shaft portions are slid with the ECU abutted against side walls forming the recess. In other words, in the electrical connection box disclosed in JP 2008-172889A, the sliding of the shaft portions of the ECU is guided by the side walls.

That is, if the electrical connection box disclosed in JP 2008-172889A does not have such side walls, the operation for engaging the shaft portions of the ECU with the shaft receiving portions of the junction box will be impaired. Thus, there are issues that the side walls cannot be omitted, and there are limitations on changes that can be made to the design of the junction box.

Therefore, it is an object to provide an electrical unit and an attachment method that facilitates attachment of a second electrical device to a first electrical device and can increase the degree of freedom in change of the design of the first electrical device.

SUMMARY

An electrical unit according to an embodiment of the present disclosure including a casing-shaped first electrical device having one surface provided with an engagement recess, and a second electrical device configured to be attached to the one surface and having an engagement portion configured to slide over the one surface and engage with the engagement recess, the electrical unit including: a slit formed in the one surface and configured to guide sliding of the engagement portion to the engagement recess; and a rib provided on the engagement portion and configured to be inserted into the slit during sliding of the engagement portion.

An attachment method for attaching a second electrical device, which has an engagement portion to be engaged with an engagement recess, to a casing-shaped first electrical device having one surface provided with the engagement recess, the method including: inserting a rib provided on the engagement portion into one end portion out of two end portions of a slit provided in the one surface and extending to the engagement recess, the one end portion being farther from the engagement recess; sliding the engagement portion over the one surface along the slit; and engaging the engagement portion with the engagement recess at another end portion of the slit.

Advantageous Effects

With the present disclosure, attaching of the second electrical device to the first electrical device is facilitated, and the degree of freedom in change of the design of the first electrical device can be increased.

DETAILED DESCRIPTION OF PREFERRED EMBODIMENTS

Figure 1:
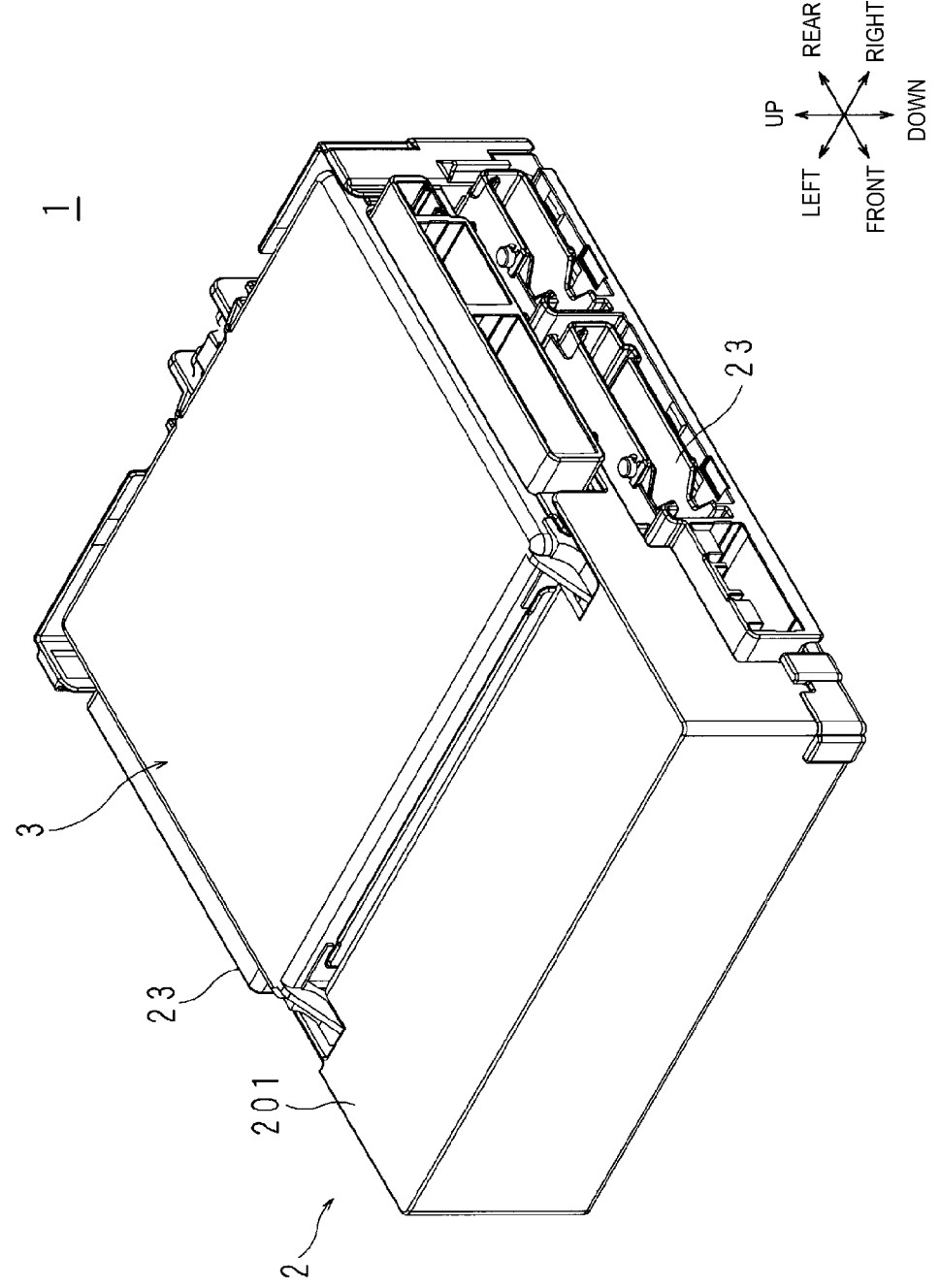
FIG. 1 is a perspective view of an electrical unit according to Embodiment 1.

First, embodiments of the present disclosure will be listed and described. Also, at least portions of the embodiments described below may be combined as necessary.

An electrical unit according to an embodiment of the present disclosure including a casing-shaped first electrical device having one surface provided with an engagement recess, and a second electrical device configured to be attached to the one surface and having an engagement portion configured to slide over the one surface and engage with the engagement recess, the electrical unit including: a slit formed in the one surface and configured to guide sliding of the engagement portion to the engagement recess; and a rib provided on the engagement portion and configured to be inserted into the slit during sliding of the engagement portion.

In such an embodiment, when the engagement portion of the second electrical device slides, the rib of the engagement portion moves while inserted into the slit. Thus, the engagement portion moves along the slit, and sliding of the engagement portion is guided.

An electrical unit according to an embodiment of the present disclosure wherein the slit has a widened portion at an end portion farther from the engagement recess.

In such an embodiment, the slit has the widened portion, and thus the ease of operability can be improved by inserting the rib of the engagement portion through the widened portion when inserting the rib into the slit.

An electrical unit according to an embodiment of the present disclosure wherein the second electrical device is casing-shaped and has a contact surface configured to come into contact with the one surface, the engagement portion protrudes from a side surface adjacent to the contact surface, the engagement portion has a first surface and a second surface that are parallel to the contact surface and the side surface, and a curved surface connecting the first surface and the second surface to each other, and the rib protrudes from the first surface and the curved surface.

In such an embodiment, the rib is also formed on the curved surface, and thus, even if the engagement portion slides while the second electrical device is stood oblique to the one surface of the first electrical device, the rib is sandwiched by the slit, and sliding of the engagement portion is guided.

An electrical unit according to an embodiment of the present disclosure wherein the rib is tapered toward a protruding end.

In such an embodiment, the rib is tapered toward the protruding end, and thus the ease of operability can be increased when the rib is inserted into the slit.

An electrical unit according to an embodiment of the present disclosure further including a blocking wall continuous with the one surface and configured to stop sliding of the engagement portion inside the engagement recess, wherein the slit extends from the one surface to a position on the blocking wall, and the rib extends from the first surface to a position on the second surface.

In such an embodiment, the slit extends from the first surface to a position on the blocking wall, and the rib extends from the first surface of the engagement portion to a position on the second surface, and thus sliding of the engagement portion is more reliably guided.

An attachment method for attaching a second electrical device, which has an engagement portion to be engaged with an engagement recess, to a casing-shaped first electrical device having one surface provided with the engagement recess, the method including: inserting a rib provided on the engagement portion into one end portion out of two end portions of a slit provided in the one surface and extending to the engagement recess, the one end portion being farther from the engagement recess; sliding the engagement portion over the one surface along the slit; and engaging the engagement portion with the engagement recess at another end portion of the slit.

In such an embodiment, when the engagement portion of the second electrical device slides, the rib of the engagement portion moves while sandwiched by the slit. Thus, the engagement portion moves along the slit, and sliding of the engagement portion is guided.

An electrical unit according to embodiments of the present disclosure will be described below with reference to the drawings. Note that the present disclosure is not limited to the configurations illustrated in the embodiments, but is indicated by the claims, and all changes that come within the meaning and range of equivalency of the claims are intended to be embraced therein.

Embodiment 1

FIG. 1 is a perspective view of an electrical unit 1 according to Embodiment 1. For the sake of convenience, in the present embodiment, the front, rear, left, and right of the electrical unit 1 are defined by the front-rear, left-right, and up-down directions shown in the drawings. The thus-defined front-rear, left-right, and up-down directions are used in the following description.

The electrical unit 1 includes a junction box 2 (first electrical device) and an engine control unit (ECU) 3 (second electrical device) that is attached to the junction box 2. The junction box 2 and the ECU 3 are detachably joined to each other.

Figure 2:
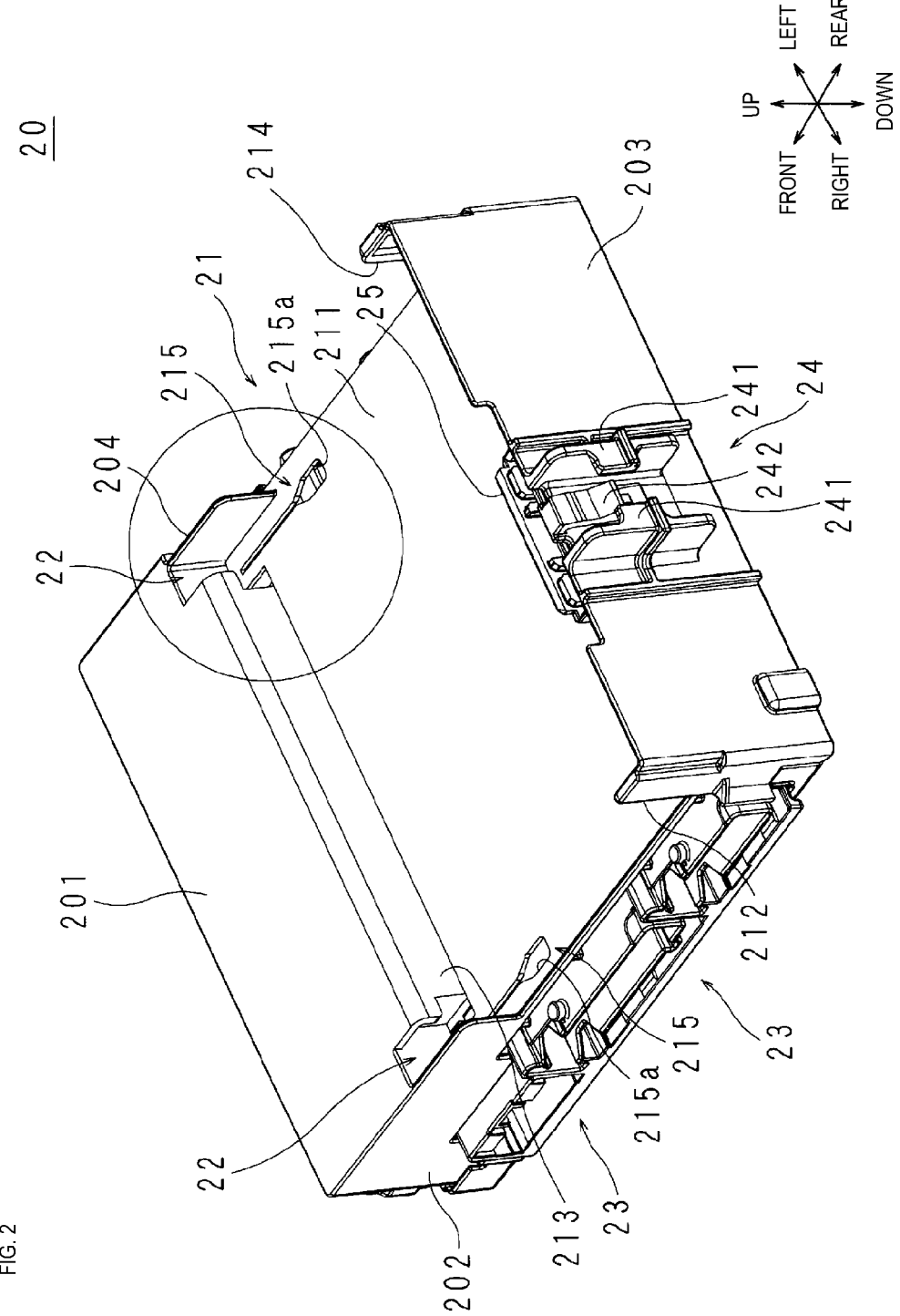
FIG. 2 is a perspective view showing a junction box of the electrical unit.
Figure 3:
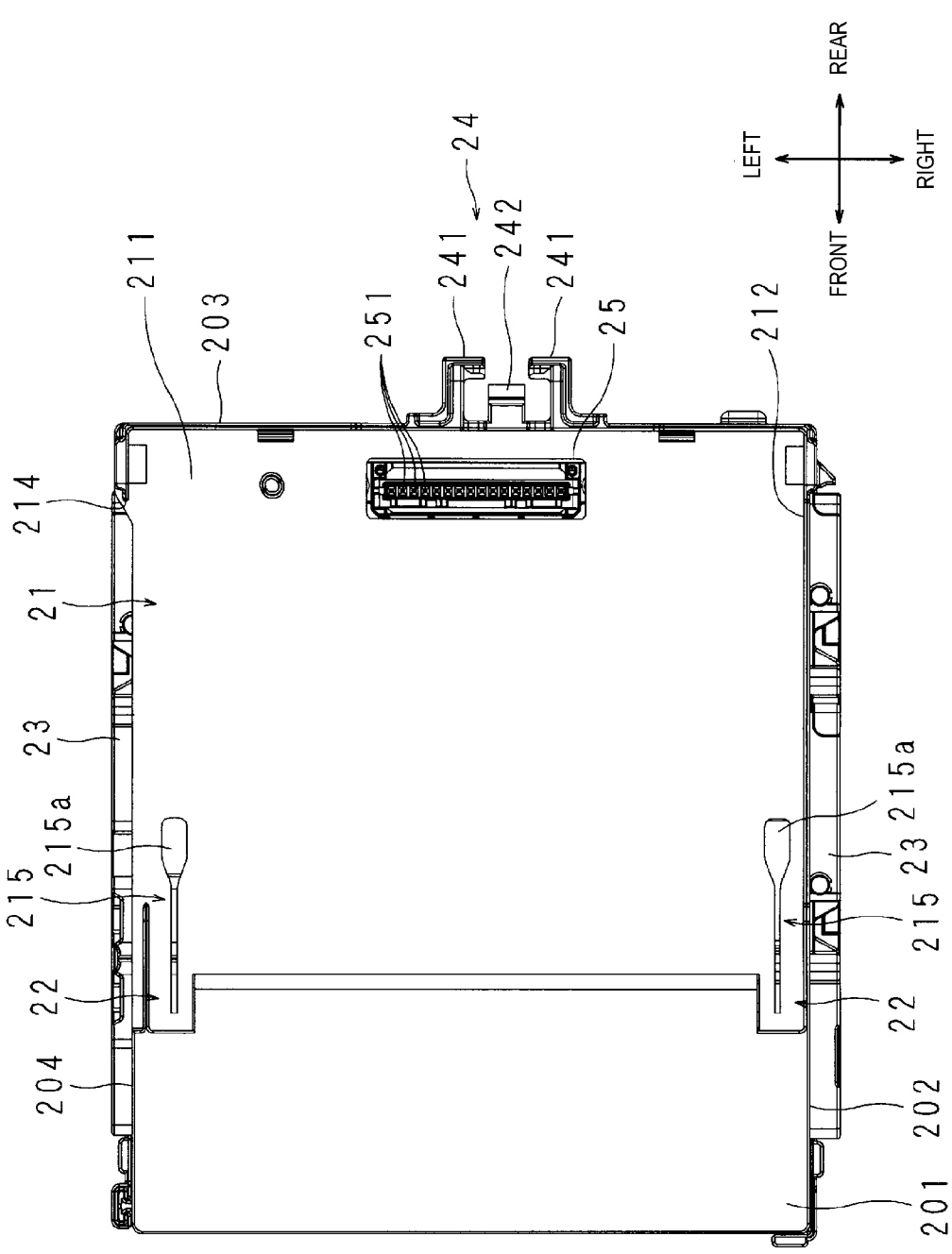
FIG. 3 is a plan view showing the junction box of the electrical unit.

FIG. 2 is a perspective view of the junction box 2 of the electrical unit 1, and FIG. 3 is a plan view of the junction box 2 of the electrical unit 1.

The junction box 2 has a case member 20 that is made of an insulating resin, and a substrate (not shown) is housed in the case member 20. The case member 20 has a flattened parallelepiped shape whose upper portion is provided with a rectangular attachment recess 21 to which the ECU 3 is attached. The attachment recess 21 is formed over a range spanning approximately the rear half of the case member 20. An upper surface 201 that has a rectangular shape elongated in the left-right direction is provided on the front side of the case member 20. The rear side edge of the upper surface 201 is continuous with a perpendicular surface 213 that extends perpendicular to a bottom 211 of the attachment recess 21. The edge portion where the upper surface 201 and the perpendicular surface 213 intersect is chamfered.

A left side surface 204 and a right side surface 202 of the case 20 are respectively provided with connectors 23. Specifically, the left side surface 204 and the right side surface 202 are each provided with a rectangular through hole that extends in the front-rear direction, and the connectors 23 protrude to the outside of the case member 20 via the through holes in the left side surface 204 and the right side surface 202.

Also, an upper portion of the left side surface 204 is provided with a rectangular notch 214 to which a later-described connector 31 of the ECU 3 is to be engaged, and an upper portion of the right side surface 202 is also provided with a rectangular notch 212 to which a connector 31 of the ECU 3 is to be engaged. The notches 212 and 214 are cut-outs that are formed in the right side surface 202 and the left side surface 204 and extend to the bottom 211 of the attachment recess 21.

Furthermore, a rear side surface 203 of the case member 20 is provided with a lock portion 24 for preventing dislodging when the ECU 3 is attached to the attachment recess 21. The lock portion 24 is provided at a substantially central portion of the rear side surface 203, and includes a locking hook 242 that locks a later-described locked portion 33 of the ECU 3, and a pair of guides 241 that respectively protrude from left and right sides of the locking hook 242 and each have an L shape as seen in a plan view.

A male connector 25 that is to be connected to a later-described female connector 34 of the ECU 3 protrudes from a rear end portion of the bottom 211 of the attachment recess 21 (see FIG. 3). The male connector 25 electrically connects the substrate housed in the case member 20 to the ECU 3. The male connector 25 has a plurality of pins 251 that stand upright inside a rectangular tube that is elongated in the left-right direction.

Also, the upper surface 201 of the case member 20 is provided with shaft receiving recesses 22 (engagement recesses) at two corners on the front side of the attachment recess 21. The shaft receiving recesses 22 engage with later-described engagement shaft portions 32 of the ECU 3. The left shaft receiving recess 22 and the right shaft receiving recess 22 have the same shape, and thus only the left shaft receiving recess 22 will be described below.

Figure 4:
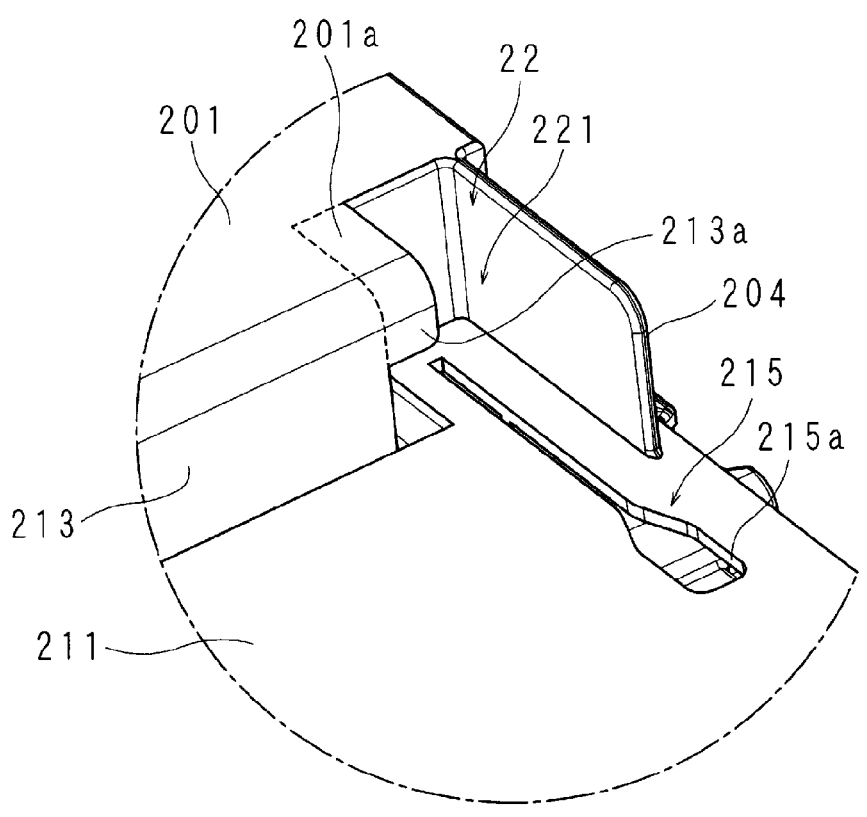
FIG. 4 is an enlarged view of a portion circled in FIG. 2.

FIG. 4 is an enlarged view of a portion circled in FIG. 2. That is, FIG. 4 shows the left shaft receiving recess 22. The shaft receiving recess 22 has a recess 221, and in the recess 221, a rectangular notch as seen in a plan view is formed at a rear corner of the upper surface 201, and an inner wall that extends perpendicularly downward is provided so as to be continuous with a cut-out side edge (see the dotted line in FIG. 4). The recess 221 is formed by the inner wall and the left side surface 204.

Also, among the side edges of the upper surface 201 that face the shaft receiving recess 22, the side edge facing the left side surface 204 is provided with an extension piece 201*a* extending toward the left side surface 204 in a direction extending along the plane of the upper surface 201.

Also, among the side edges of the perpendicular surface 213 that face the shaft receiving recess 22, the side edge facing the left side surface 204 is provided with an extension piece 213*a* extending toward the left side surface 204 in a direction extending along the plane of the perpendicular surface 213. The extension piece 213*a* is only provided at an upper portion of the side edge toward the extension piece 201*a*. The extension piece 201*a* and the extension piece 213*a* are formed as one piece.

As described above, the extension piece 201*a* limits movement of the engagement shaft portion 32 in the up-down direction after engagement between the shaft receiving recess 22 and the engagement shaft portion 32. The extension piece 213*a* limits movement of the engagement shaft portion 32 in the front-rear direction after engagement between the shaft receiving recess 22 and the engagement shaft portion 32.

The bottom 211 of the attachment recess 21 is provided with slits 215 for guiding sliding of the engagement shaft portions 32 to the shaft receiving recesses 22, which will be described later. The slits 215 extend completely through the bottom 211 of the attachment recess 21, and are provided at positions near the shaft receiving recesses 22 at two respective end portions of the bottom 211 in the left-right direction. The left slit 215 and the right slit 215 have the same shape, and thus only the left slit 215 will be described below.

The left slit 215 has a substantially straight shape, and extends in the front-rear direction to the inside of the corresponding shaft receiving recess 22. The slit 215 has a widened portion 215*a* at one end portion thereof that is farther from the shaft receiving recess 22. That is, the width (length) of the slit 215 in the left-right direction is larger at the widened portion 215*a* farther from the shaft receiving recess 22.

Figure 5:
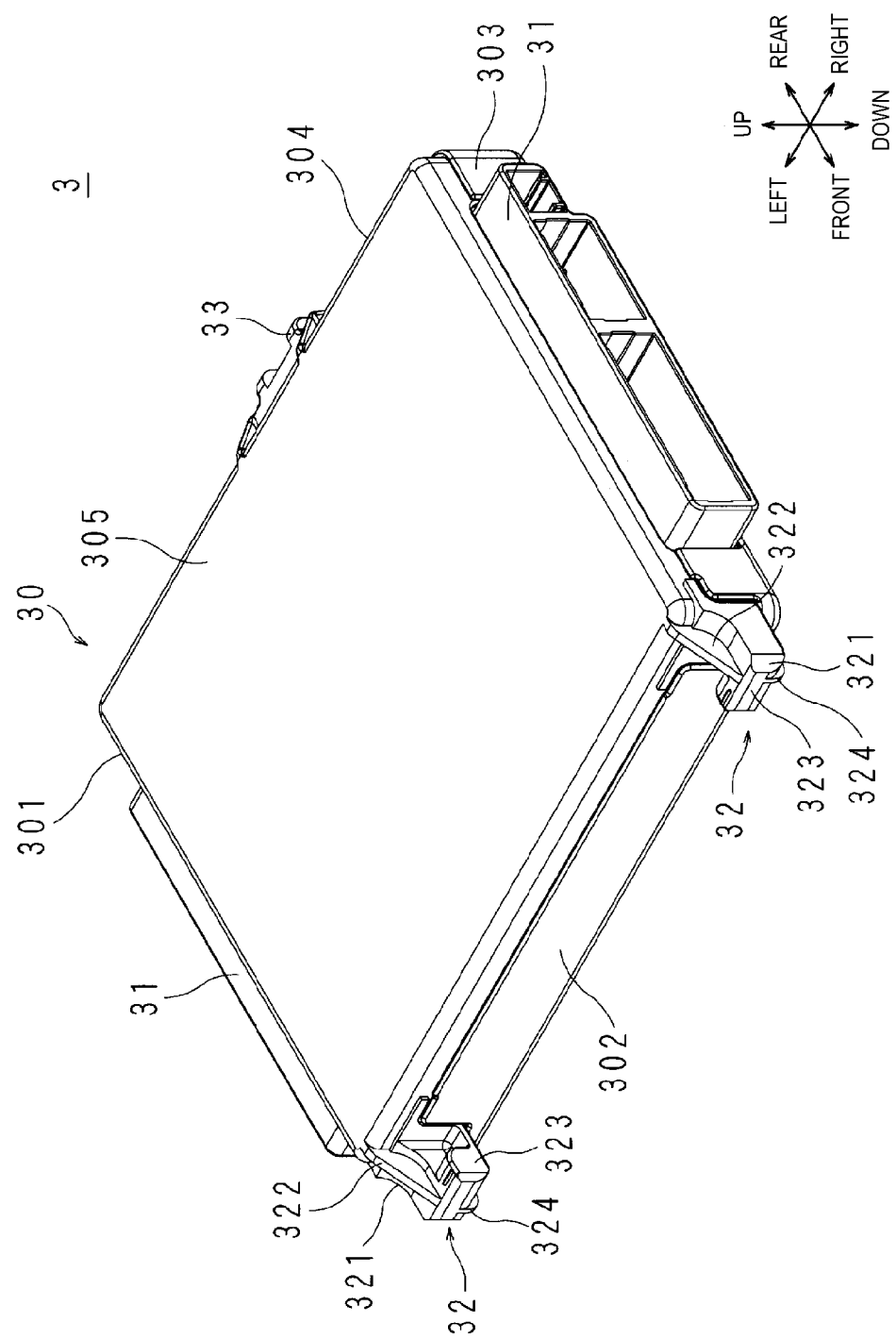
FIG. 5 is a perspective view of an ECU of the electrical unit as seen from above.
Figure 6:
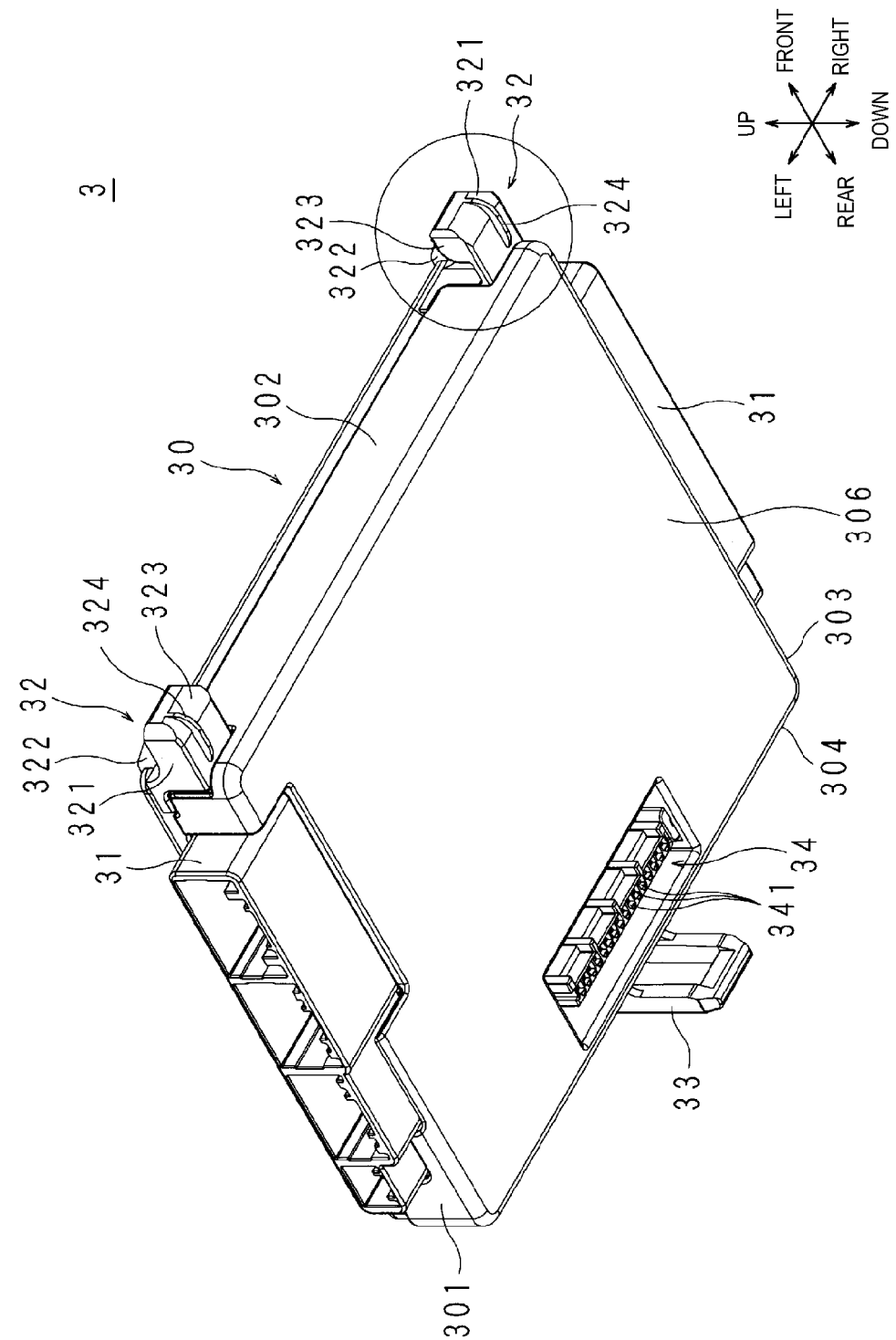
FIG. 6 is a perspective view of the ECU of the electrical unit as seen from below.

FIG. 5 is a perspective view of the ECU 3 of the electrical unit 1 as seen from above, and FIG. 6 is a perspective view of the ECU 3 of the electrical unit 1 as seen from below.

The ECU 3 is equipped with electronic elements such as a micro-computer in which a program for realizing a control function that corresponds to the vehicle type or vehicle grade is stored.

As shown in FIGS. 5 and 6, the ECU 3 is provided with a case member 30 that has a flattened parallelepiped shape. The case member 30 has a rectangular upper surface 305, and also has a left side surface 301, a right side surface 303, a front side surface 302, and a rear side surface 304 that are adjacent to the upper surface 305.

The left side surface 301 and the right side surface 303 of the ECU 3 are respectively provided with connectors 31. Specifically, the left side surface 301 and the right side surface 303 are each provided with a rectangular through hole that extends in the front-rear direction, and the connectors 31 protrude to the outside of the case member 30 via the through holes in the left side surface 301 and the right side surface 303.

As described above, when the ECU 3 is attached to the junction box 2, the left connector 31 and the right connector 31 of the ECU 3 engage with the notch 214 of the left side surface 204 and the notch 212 of the right side surface 202 of the junction box 2, correspondingly.

Furthermore, the rear side surface 304 of the case member 30 is provided with the locked portion 33 for preventing dislodging when the ECU 3 is attached to the attachment recess 21 of the junction box 2. The locked portion 33 is provided at a substantially central portion of the rear side surface 304 and has a hollow rectangular shape that extends downward beyond the rear end surface 304.

When the ECU 3 is attached to the junction box 2, the locked portion 33 is inserted downward while being sandwiched by the pair of guides 241 of the lock portion 24 of the junction box 2, and the locking hook 242 of the lock portion 24 moves along the inner side of the locked portion 33 and engages with the locked portion 33 at a predetermined position.

The case member 30 has the female connector 34 that corresponds to the male connector 25 of the junction box 2, on a lower surface 306 (contact surface) that opposes the upper surface 305 (FIG. 6). When the ECU 3 is attached to the junction box 2, the lower surface 306 is in contact with the bottom 211 of the attachment recess 21 of the junction box 2.

The female connector 34 is provided at a rear end portion of the lower surface 306. The female connector 34 has a plurality of pins 341 that stand upright inside a rectangular recess that is elongated in the left-right direction. When the ECU 3 is attached to the junction box 2, the male connector 25 of the junction box 2 is fitted to the female connector 34 of the ECU 3, and the junction box 2 and the ECU 3 are electrically connected to each other.

The front side surface 302 of the case member 30 is provided with the engagement shaft portions 32 (engagement portions) that engage with the shaft receiving recesses 22 of the junction box 2. The engagement shaft portions 32 are provided protruding slightly above the lower edge of the front side surface 302 at two end portions of the front side surface 302 in the left-right direction. The left engagement shaft portion 32 and the right engagement shaft portion 32 have the same shape, and thus only the right engagement shaft portion 32 will be described below.

Figure 7:
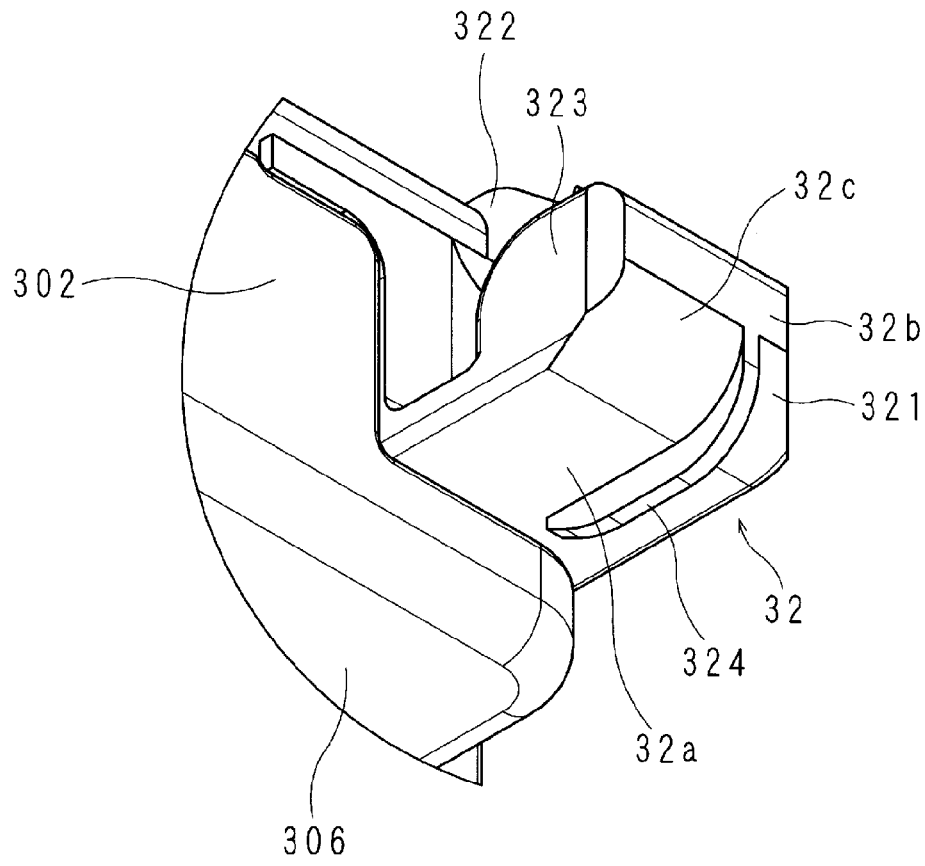
FIG. 7 is an enlarged view of a circled portion in FIG. 6.

FIG. 7 is an enlarged view of a portion circled in FIG. 6. That is, FIG. 7 shows the right engagement shaft portion 32.

The right engagement shaft portion 32 has a shaft holding portion 321 that stands upright from the right end of the front side surface 302 so as to be perpendicular to the front side surface 302. The shaft holding portion 321 is tapered toward the protruding end thereof. That is, the leading end portion of the shaft holding portion 321 is shorter than the base portion in the up-down direction. Also, the upper surface of the shaft holding portion 321 is provided with a substantially triangular reinforcement rib 322.

An engagement shaft 323 is provided extending from the leading end of the shaft holding portion 321 toward the left engagement shaft portion 32. The engagement shaft 323 includes a columnar portion and a base portion that is interposed between the columnar portion and the front side surface 302.

As described below, the engagement shaft portion 32 has a rib 324 that is moved while being sandwiched in the slit 215 when the engagement shaft portion 32 is slid over the bottom 211 of the attachment recess 21 of the junction box 2. The rib 324 is fin shaped, for example.

Also, the engagement shaft portion 32 has, on an outer surface, a first surface 32a that is parallel to the lower surface 306, and a second surface 32b that is parallel to the front side surface 302, and also includes a curved surface 32c that connects the first surface 32a and the second surface 32b. The rib 324 is provided protruding from the first surface 32a and extending to a position on the curved surface 32c so as not to protrude forward of the second surface 32b. The leading end edge of the rib 324 is curved.

Figure 8:
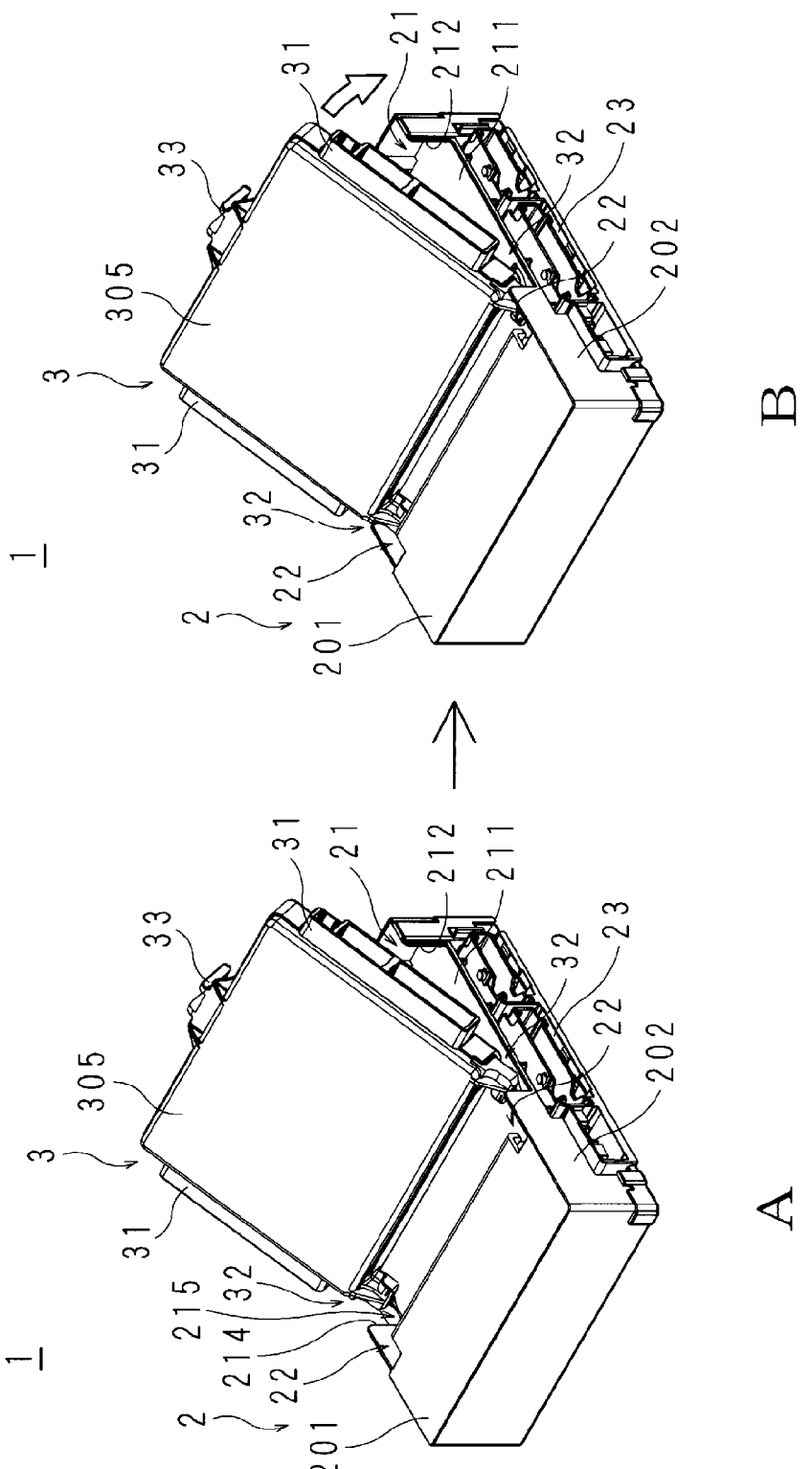
FIG. 8 is a diagram for describing a predetermined process in attachment of the ECU to the junction box.
Figure 9:
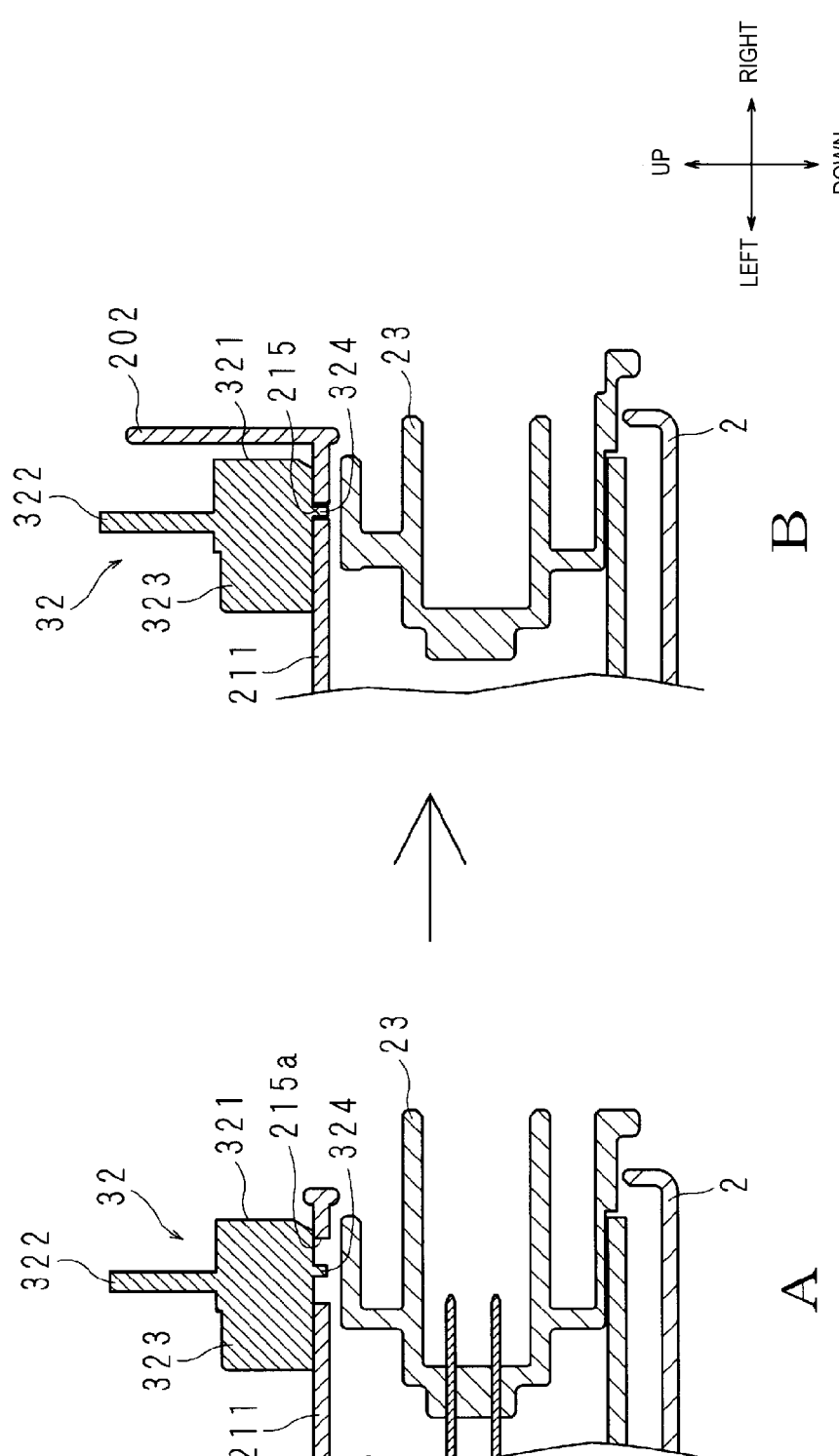
FIG. 9 is a cross-sectional view for describing the process shown in FIG. 8.

The method for attaching the ECU 3 to the junction box 2 will be described below. FIG. 8 is a diagram for describing a predetermined process in attachment of the ECU 3 to the junction box 2, and FIG. 9 is a cross-sectional view for describing the process shown in FIG. 8. For the sake of convenience, FIG. 9 shows the right side of the junction box 2 and the ECU 3.

First, an operator inserts the ribs 324 of the engagement shaft portions 32 of the ECU 3 into the slits 215 provided in the bottom 211 of the attachment recess 21 of the junction box 2. As described above, the engagement shaft portions 32 protrude slightly above the lower edges of the front side surfaces 302, and thus, an operator moves the ECU 3 into an oblique orientation, as shown in FIG. 8A, and mainly inserts the portions of the ribs 324 of the engagement shaft portions 32 that protrude from the curved surfaces 32c into the widened portions 215a of the slits 215. FIG. 9A is a partial longitudinal cross-section corresponding to FIG. 8A.

As described above, the ribs 324 extend to the curved surfaces 32c of the engagement shaft portions 32, and thus the ribs 324 can be placed in the slits 215 while the ECU 3 is stood obliquely, and as shown in FIG. 9A, the width of the slits 215 is larger at the widened portions 215a, and thus the ribs 324 can be inserted into the slits 215.

As such, with the ribs 324 inserted into the widened portions 215a, the operator slides the engagement shaft portions 32 (ECU 3) over the bottom 211 of the attachment recess 21 to the shaft receiving recesses 22. FIG. 8B shows the engagement shaft portions 32 being slid along the slits 215, and FIG. 9B is a partial longitudinal cross-section corresponding to FIG. 8B. At this time, the ribs 324 are inserted into the slits 215, and thus sliding of the engagement shaft portions 32 is guided by the slits 215, and the engagement shaft portions 32 slide along the slits 215 to the shaft receiving recesses 22.

Then, the engagement shaft portions 32 pass between the bottom 211 of the attachment recess 21 and the extension pieces 213a and are inserted into the recesses 221, and the sliding of the engagement shaft portions 32 is stopped at the other ends of the slits 215.

Figure 10:
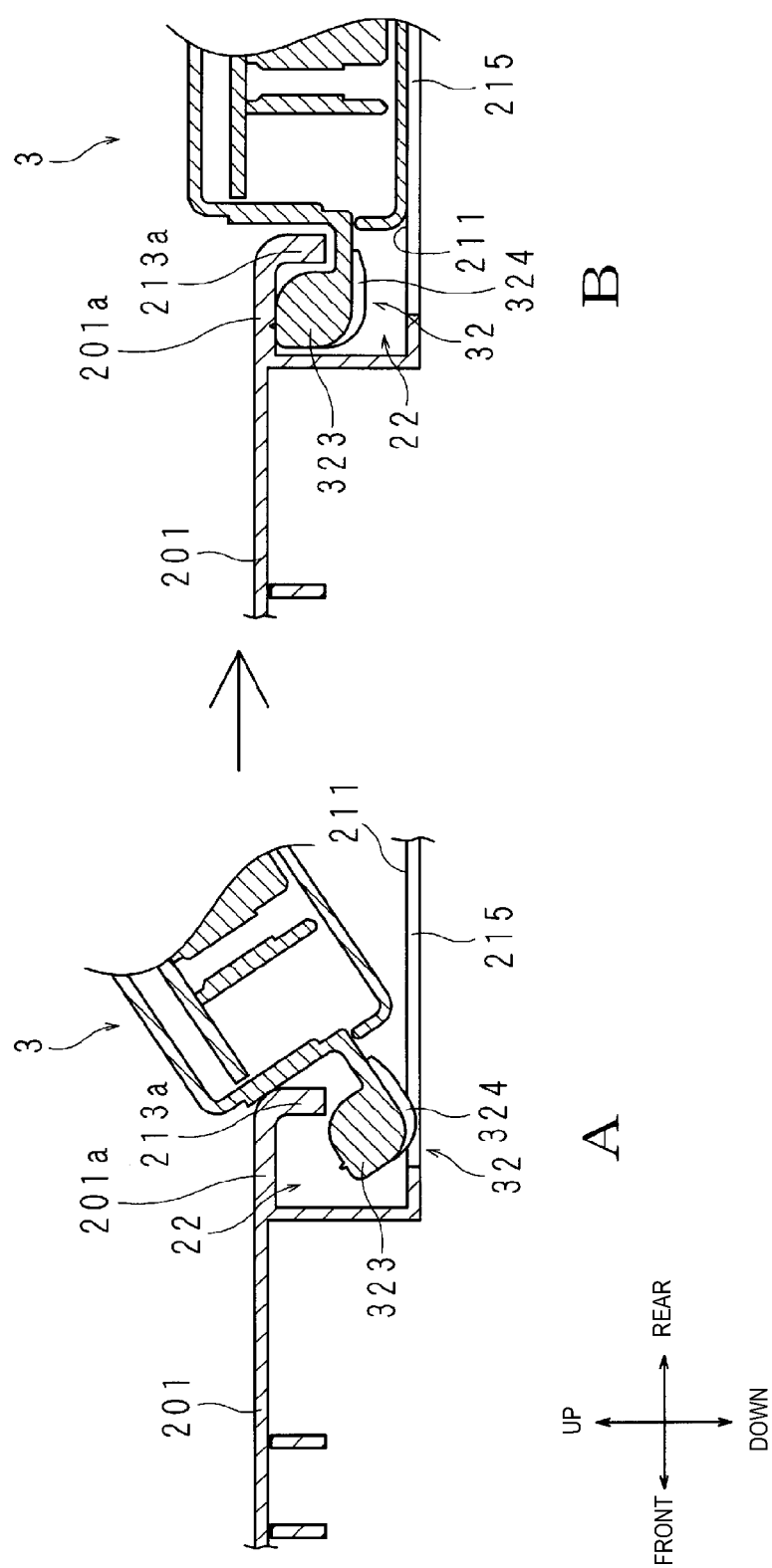
FIG. 10 is a partial longitudinal cross-section showing a state in which an engagement shaft portion has been inserted into a recess when attaching the ECU to the junction box.

FIG. 10 is a partial longitudinal cross-section showing a state in which the engagement shaft portion 32 has been inserted into the recess 221 when attaching the ECU 3 to the junction box 2.

When the engagement shaft portion 32 is inserted into the recess 221, and the sliding of the engagement shaft portion 32 is stopped (see FIG. 10A), the operator pivots the ECU 3 downward (see the white arrow in FIG. 8B) about the engagement shaft 323 with the engagement shaft 323 serving as an axis.

Thus, the lower surface 306 of the ECU 3 abuts against the bottom 211 of the attachment recess 21, and the engagement shaft 323 separates from the bottom 211 of the attachment recess 21 and moves upward to abut against the inner side of the extension piece 201a, and thus engagement between the engagement shaft portion 32 and the shaft engagement recess 22 is complete (see FIG. 10B). Also, the locked portion 33 of the ECU 3 is fitted into the lock portion 24 of the junction box 2 to engage the lock portion 24 and the locked portion 33 to each other, as described above.

When engagement between the engagement shaft portion 32 and the shaft receiving recess 22 is complete, movement of the engagement shaft portion 32 in the up-down direction is limited by the extension piece 201a, and movement of the engagement shaft portion 32 in the front-rear direction is limited by the extension piece 213a. Furthermore, the lock portion 24 and the locked portion 33 are engaged with each other, and thus the ECU 3 can be reliably prevented from dislodging from the junction box 2.

At this time, the male connector 25 of the junction box 2 is fitted into the female connector 34 of the ECU 3, and contact between the pins 251 of the male connector 25 and the pins 341 of the female connector 34 bring the ECU 3 and the junction box 2 into electrical contact with each other.

Thus, attaching of the ECU 3 to the junction box 2 is complete.

As described above, in attaching the ECU 3 to the junction box 2, in order to engage the engagement shaft portion 32 with the shaft receiving recess 22, an operation needs to be performed in which the engagement shaft portion 32 is slid over the bottom 211 of the attachment recess 21, and the engagement shaft portion 32 passes between the bottom 211 of the attachment recess 21 and the extension piece 213a and is inserted into the recess 221. The ease of performing this operation can be increased by using a guiding member that guides sliding of the engagement shaft portion 32 to the shaft receiving recess 22.

Ordinarily, when sliding the engagement shaft portion 32, the left side surface 204 and the right side surface 202 of the attachment recess 21 of the junction box 2 can be used as guiding members. However, in the electrical unit 1 of this embodiment, notches are formed in the left side surface 204 and the right side surface 202 so as to allow for the connectors 31 provided on the ECU 3, and thus cannot be used as guiding members.

In contrast to this, in the electrical unit 1 of the present embodiment, as described above, the junction box 2 is provided with the slits 215 on the bottom 211 of the attachment recess 21, the ECU 3 is provided with the ribs 324 on the engagement shaft portions 32, and the sliding of the engagement shaft portions 32 is guided to the shaft receiving recesses 22. Thus, it is possible to improve the ease of performing the operation for engaging the engagement shaft portions 32 with the shaft receiving recess 22.

Also, as described above, the left side surface 204 and the right side surface 202 do not function as guide members when the engagement shaft portions 32 are being slid, and thus, even if the notch 214 is formed on the left side surface 204 and the notch 212 is formed on the right side surface 202, no issue arises when the engagement shaft portions 32 are slid to engage the engagement shaft portions 32 with the shaft receiving recesses 22. Thus, the degree of freedom in making changes to the design of the junction box 2 is increased.

The case where the thickness of the ribs 324 is constant was given as an example above, but the present disclosure is not limited to this. Each rib 324 protruding from the first surface 32a of the engagement shaft portion 32 and extending to a position on the curved surface 32c may be configured such that the thickness thereof is smaller at the leading end portion of the protruding end thereof. In this case, an effect can be realized where the ribs 324 can be more easily inserted into the slits 215.

Embodiment 2

The electrical unit 1 according to Embodiment 2 has the same configuration as Embodiment 1 except that the configurations of the shaft engagement recesses 22 and the slits 215 of the junction box 2 and the configuration of the engagement shaft portions 32 of the ECU 3 are different.

Figure 11:
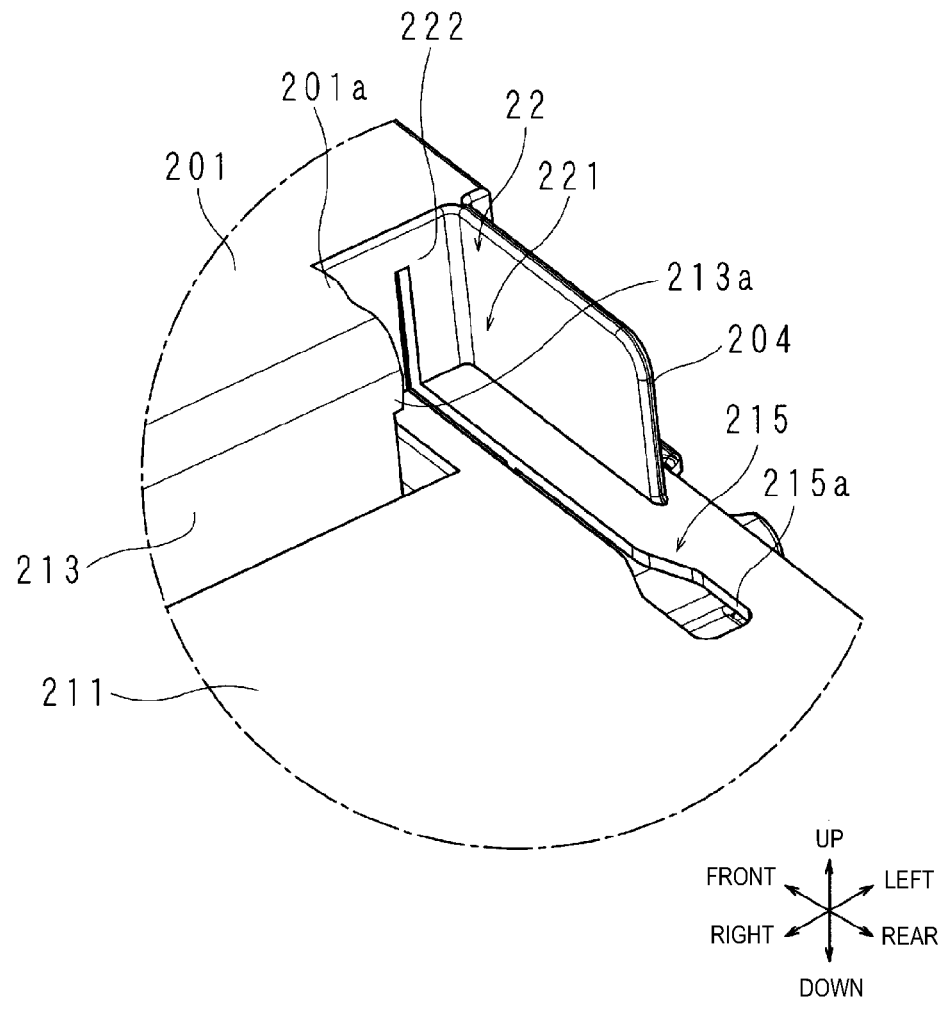
FIG. 11 is a diagram showing the vicinity of a shaft receiving recess on the left side of an electrical unit according to Embodiment 2.

FIG. 11 is a diagram showing the vicinity of the shaft receiving recess 22 on the left side of the electrical unit 1 according to Embodiment 2. In the electrical unit 1 of Embodiment 2, the left shaft receiving recess 22 and the right shaft receiving recess 22 have the same shape, and the left slit 215 and the right slit 215 also have the same shape, and thus only the left shaft receiving recess 22 and the left slit 215 will be described below.

Similarly to Embodiment 1, the shaft receiving recess 22 has the recess 221. In the recess 221, two corners on the rear side of the upper surface 201 are cut out into rectangular shapes as seen in a plan view, and inner walls that extend perpendicularly downward are provided so as to be continuous with the cut-out side edges. A blocking wall 222 of the inner wall that is adjacent to the upper surface 201 and the left side surface 204 stops sliding of the engagement shaft portion 32, as described above.

In the electrical unit 1 of Embodiment 2 as well, similarly to Embodiment 1, the extension piece 201a extending toward the left side surface 204 is provided on the upper surface 201, and the extension piece 213a extending toward the left side surface 204 is provided at an upper portion of the perpendicular surface 213. In FIG. 11, portions of the extension piece 201a and the perpendicular surface 213 are omitted.

The slits 215 for guiding sliding of the engagement shaft portions 32 to the shaft receiving recesses 22 are formed in the bottom 211 of the attachment recess 21. The slits 215 are respectively formed at positions toward the shaft receiving recesses 22 at two end portions of the bottom 211 in the left-right direction.

Each slit 215 has a substantially straight shape, and extends in the front-rear direction to the inside of the corresponding shaft receiving recess 22. The slit 215 has the widened portion 215a at one end portion thereof that is farther from the shaft receiving recess 22. The slit 215 includes the shaft receiving recess 22, and extends to the blocking wall 222 that is continuous with the bottom of the shaft receiving recess 22. That is, the slit 215 extends from the upper portion to the lower end of the blocking wall 222 and is connected to the slit 215 formed in the bottom of the shaft receiving recess 22. In other words, the slit 215 extends continuously from the bottom 211 of the attachment recess 21, across the bottom of the shaft receiving recess 22, to the blocking wall 222.

Figure 12:
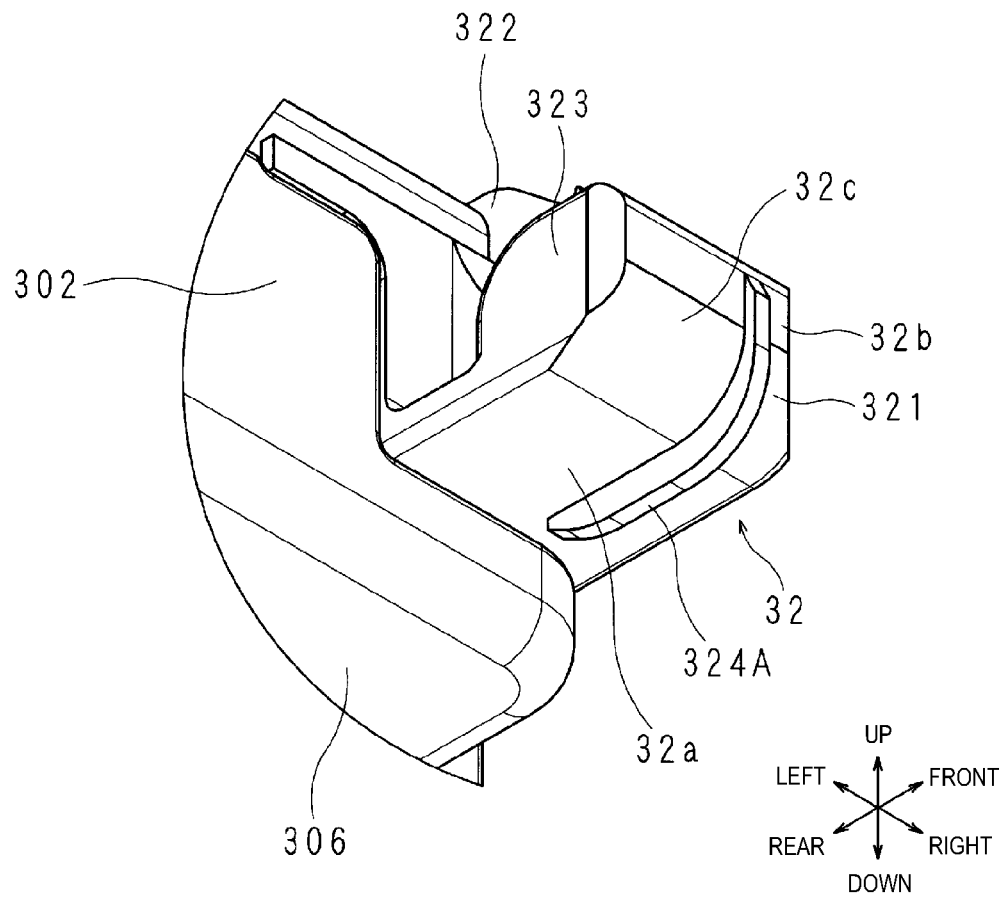
FIG. 12 is a diagram showing the vicinity of an engagement shaft portion on the right side of the electrical unit according to Embodiment 2.

FIG. 12 is a diagram showing the vicinity of the engagement shaft portion 32 on the right side of the electrical unit 1 according to Embodiment 2. In the electrical unit 1 of Embodiment 2, the left engagement shaft portion 32 and the right engagement shaft portion 32 have the same shape, and thus only the right engagement shaft portion 32 will be described below.

Similarly to Embodiment 1, the right engagement shaft portion 32 has the shaft holding portion 321 that stands upright from the right end of the front side surface 302 so as to be perpendicular to the front side surface 302, and the reinforcement rib 322 is provided on the upper surface of the shaft holding portion 321. Also, the engagement shaft 323 is provided extending from the leading end of the shaft holding portion 321 toward the left engagement shaft portion 32.

Also, the engagement shaft portion 32 has a rib 324A that is moved while inserted into the slit 215 when the engagement shaft portion 32 slides along the bottom 211 of the attachment recess 21 of the junction box 2. The rib 324A is fin shaped, for example.

The engagement shaft portion 32 has the first surface 32a that is parallel to the lower surface 306, the second surface 32b that is parallel to the front side surface 302, and the curved surface 32c that connects the first surface 32a and the second surface 32b. The rib 324A is provided protruding from the first surface 32a, across the curved surface 32c, to the second surface 32b. The leading end edge of the rib 324A is curved.

Below, a method for attaching the ECU 3 to the junction box 2 of the electrical unit 1 according to Embodiment 2 will be described.

First, an operator inserts the ribs 324A of the engagement shaft portions 32 of the ECU 3 respectively into the slits 215 provided in the bottom 211 of the attachment recess 21 of the junction box 2. Specifically, an operator moves the ECU 3 into an oblique orientation, as shown in FIG. 8A, and mainly inserts the portions of the ribs 324A of the engagement shaft portions 32 that protrude from the curved surfaces 32c into the widened portions 215a of the slits 215 (see FIG. 9A).

In this way, the operator slides the engagement shaft portions 32 (ECU 3) to the shaft receiving recesses 22 with the ribs 324A inserted into the widened portions 215a. At this time, the ribs 324A are held sandwiched in the slits 215, and thus the sliding of the engagement shaft portions 32 is guided by the slits 215, and the engagement shaft portions 32 are slid along the slits 215 to the shaft receiving recesses 22 (see FIG. 8B and FIG. 9B).

The engagement shaft portions 32 pass between the bottom 211 of the attachment recess 21 and the extension pieces 213a and are inserted into the recesses 221, and sliding of the engagement shaft portions 32 is stopped upon abutting against the blocking walls 222 of the recesses 221.

As described above, in the electrical unit 1 according to Embodiment 2, each of the ribs 324A protrude from the first surface 32a of the engagement shaft portion 32 and extend across the curved surface 32c to the second surface 32b, and each slit 215 extends continuously from the bottom 211 of the attachment recess 21, across the bottom of the shaft receiving recess 22, to the blocking wall 222.

Thus, even when the engagement shaft portion 32 abuts against the blocking wall 222 and sliding of the engagement shaft portion 32 is stopped, the portion of the rib 324A protruding from the second surface 32b remains inserted into the slit 215 of the blocking wall 222, and the portion of the rib 324A protruding from the first surface 32a remains inserted into the slit 215 in the bottom of the shaft receiving recess 22. Specifically, sliding of the engagement shaft portion 32 is guided until the engagement shaft portion 32 has slid over the bottom 211 of the attachment recess 21 and been inserted into the recess 221, and sliding thereof has been stopped due to abutting against the blocking wall 222 of the recess 221. Thus, in the electrical unit 1 according to Embodiment 2, sliding of the engagement shaft portion 32 is more reliably guided.

Then, the operator pivots the ECU 3 downward about the engagement shaft 323 with the engagement shaft 323 serving as an axis (see white arrow in FIG. 8B). Accordingly, the lower surface 306 of the ECU 3 abuts against the bottom 211 of the attachment recess 21 and the engagement shaft 323 moves upward to abut against the inside of the extension piece 201*a*, and thus engagement between the engagement shaft portion 32 and the shaft receiving recess 22 is complete (see FIG. 10B). Also, the operator engages the lock portion 24 of the junction box 2 with the lock portion 33 of the ECU 3. At this time, the male connector 25 of the junction box 2 is fitted into the female connector 34 of the ECU 3, and the ECU 3 and the junction box 2 come into electrical contact with each other.

Thus, attaching of the ECU 3 into the attachment recess 21 of the junction box 2 is completed.

As described above, in the electrical unit 1 of the present embodiment, sliding of the engagement shaft portion 32 is guided until the engagement shaft portion 32 has been inserted into the shaft receiving recess 22. Accordingly, in addition to increasing the ease of performing the operation of engaging the engagement shaft portion 32 with the shaft receiving recess 22, the accuracy of the operation can also be increased.

Portions likewise to Embodiment 1 are given like reference symbols, and detailed description thereof is omitted.

The disclosed embodiments are illustrative in all regards and not to be construed as limiting. The scope of the present disclosure is defined by the claims and not by the above disclosed description, and all changes that come within the meaning and range of equivalency of the claims are intended to be embraced therein.

The invention claimed is:

1. An electrical unit including a casing-shaped first electrical device having one surface provided with an engagement recess, and a second electrical device configured to be attached to the one surface and having an engagement portion configured to slide over the one surface and engage with the engagement recess, the electrical unit comprising:

a slit formed in the one surface and configured to guide sliding of the engagement portion to the engagement recess; and a rib provided on the engagement portion and configured to be inserted into the slit during sliding of the engagement portion; and wherein the second electrical device is casing-shaped and has a contact surface configured to come into contact with the one surface, the engagement portion protrudes from a side surface adjacent to the contact surface, the engagement portion has a first surface and a second surface that are parallel to the contact surface and the side surface, and a curved surface connecting the first surface and the second surface to each other, and the rib protrudes from the first surface and the curved surface.

2. The electrical unit according to claim 1, wherein the slit has a widened portion at an end portion farther from the engagement recess.

3. The electrical unit according to claim 1, wherein the rib is tapered toward a protruding end.

4. The electrical unit according to claim 1, further comprising a blocking wall continuous with the one surface and configured to stop sliding of the engagement portion inside the engagement recess, wherein the slit extends from the one surface to a position on the blocking wall, and the rib extends from the first surface to a position on the second surface.

5. The electrical unit according to claim 2, wherein the rib is tapered toward a protruding end.

6. An attachment method for attaching a second electrical device to a first electrical device, the second electrical device is casing-shaped and has a contact surface and an engagement portion, the first electrical device is casing-shaped and includes one surface having a side surface adjacent to the one surface to define an engagement recess, the method comprising:

providing the engagement portion with a first surface and a second surface that are parallel to the contact surface and the side surface, and a curved surface connecting the first surface and the second surface to each other;

providing a rib on the engagement portion, the rib protruding from the first surface and the curved surface;

inserting the rib into one end portion out of two end portions of a slit provided in the one surface and extending to the engagement recess, the one end portion being farther from the engagement recess;

sliding the engagement portion over the one surface along the slit; and engaging the engagement portion with the engagement recess at another end portion of the slit.

* * * * *